United States Patent
Aoki et al.

(10) Patent No.: US 6,568,612 B1
(45) Date of Patent: May 27, 2003

(54) METHOD OF AND APPARATUS FOR DISPOSING WASTE

(75) Inventors: Toshiyuki Aoki, Chiyoda (JP); Masakatsu Hayashi, Ushiku (JP); Tsutomu Hasegawa, Niiza (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/604,245

(22) Filed: Jun. 27, 2000

(30) Foreign Application Priority Data

Jun. 30, 1999 (JP) .......................................... 11-185590

(51) Int. Cl.$^7$ .............................................. B02C 19/12
(52) U.S. Cl. ........................ 241/19; 241/20; 241/24.14; 241/24.18; 241/79.1; 241/DIG. 38
(58) Field of Search ........................... 241/DIG. 38, 19, 241/20, 24.12, 24.13, 24.14, 24.18, 79.1

(56) References Cited

U.S. PATENT DOCUMENTS 5,547,134 A * 8/1996 Rubenstein .................. 241/23
5,683,040 A * 11/1997 Jakob et al. .................. 241/14
5,829,694 A * 11/1998 Chapman .................. 241/152.2

OTHER PUBLICATIONS

Japanese Patent Unexamined Publication No. 5–147040.
Japanese Patent Unexamined Publication No. 8–318256.

* cited by examiner

Primary Examiner—Mark Rosenbaum
(74) Attorney, Agent, or Firm—Antonelli, Terry, Stout & Kraus, LLP

(57) ABSTRACT

A waste disposal apparatus comprising a crushing means for crushing waste including a circuit board into fragments, and a circuit board sorting means for sorting fragments of the circuit board from the fragments of the waste crushed by the crushing means through eddy current sorting or gravity concentration so as overcome a difficulty in separation between nonferrous metals. With this arrangement, lead contained in the circuit boards can be sorted and separated without being diffused, and further, the volume of fragments of the circuit boards adapted to be mingled into fragments of other waste such as nonferrous metals and plastics can be decreased. Thus, even though waste including circuit board is directly crushed by the crushing means, thereby it is possible to enhance the quality of recovered valuables.

8 Claims, 10 Drawing Sheets

PLASTIC HOUSING RECOVERED INTO DEFFERENT COLOR AND MATERIAL GROUPS 173

METHOD OF AND APPARATUS FOR DISPOSING WASTE

BACKGROUND OF THE INVENTION

The present invention relates to a method of and an apparatus for recovering valuables which can be recycled from waste, and specifically, a method and an apparatus which are suitable for disposing waste including circuit boards.

RELATED ART

As to a process of recovering variables which can be recycled from waste, various technologies have been proposed in view of kinds of waste or valuables.

For example, Japanese Laid-Open Patent No. H5-147040 discloses a waste disposal method for waste of household appliance such as a refrigerator, wherein metal blocks are separated from waste, and then waste from which the metal blocks are removed, are pulverized into fragments, and then foaming materials are recovered from the fragments from which a gaseous foaming agent is recovered while iron, nonferrous metals and plastics are separated from frozen and pulverized fragments of the metal blocks and the fragments from which the foaming materials are removed, so as to recover the valuables. In order to separate iron, nonferrous metals and plastics, the fragments are subjected to magnetic separation in order to separate iron, and then the remaining fragments are subjected to eddy current separation under the action of eddy current generated by the application of a.c. magnetic fields so as to separate nonferrous metals and plastics. Further, nonferrous metals are then subjected to gravity concentration using difference in specific weight, or wind separation, so as to be sorted into copper, aluminum and other nonferrous metals, and similarly, the plastics are subjected to gravity concentration or wind separation so as to be sorted into different kinds.

Further, Japanese Laid-Open Patent No. H8-318256 proposes such a process that waste is manually disassembled so as to recover reusable parts such as CPU, and the remainder parts are pulverized and then sorted into iron, nonferrous metals and plastics in order to recover reusable parts as valuables. The remainder is further pulverized in order to recover valuables if present, and are finally subjected to innocuous disposal.

However, the waste disposal process disclosed in the Japanese Laid-Open Patent No. H5-147040 is unsatisfactory for disposing OA equipment including a circuit board. There have been offered the following matters which should be improved. That is, OA equipment such as a personal computer, a printer, a copier or a facsimile, includes a circuit board carrying thereon an electronic circuit component such as a CPU, and as well, solder which has been used for connecting electronic circuit components and wiring members, and which contains toxic lead, thereby it is desirable to enhance the recovery rate of solder. However, should OA equipment including such circuit boards be pulverized into fragments, without removing these circuit boards, the fragments would be dispersed around, solder and copper and aluminum wires being stuck thereto. Thus it is impossible to enhance the recovery rate of lead. Further, when copper, aluminum and the like of the nonferrous metal group are sorted by an eddy current classifier, eddy current is induced through solder and wiring stuck to the fragments of the circuit boards, and accordingly, a large volume of fragments of the circuit boards is recovered as nonferrous metal. As a result, a large volume of impurities relating to the circuit boards is mingled in separated nonferrous metals including copper and aluminum, and accordingly, the value of the separated nonferrous metals as valuables is lowered. Similarly, if the fragments of the circuit boards are sorted into plastics, the fragments of the circuit boards which are usually sheet-like, are likely to be sorted into phenol resin having a specific weight of 1.25 to 1.30 or polyvinyl chloride having a specific weight of 1.33 to 1.44 due to the affection by the shapes of the fragments when the fragments are sorted into different kinds of plastics since the specific weight of the circuit boards is in a range from 1.6 to 2.0, and accordingly, there would be caused a risk such that the degrees of purity of sorted plastics are lowered. Further, even after the fragments of the circuit boards are separated from nonferrous metals and other plastics, the remaining fragments are finally collected as dust together with plastic chips, metals chips, wiring chips and other particles, and accordingly, the volume of dust becomes very large so as to increase the costs of reclamation becomes high, resulting in increase in both cost of waste disposal and burden upon the environment.

In order to solve the above-mentioned problems, Japanese Patent No. H8-318256 discloses a method in which OA equipment is manually disassembled or wrecked so as to remove circuit boards, and then, valuables including CPUs are recovered as reusable parts from the circuit boars. However, it is difficult to remove circuit boards from OA equipment in view of its structure since the OA equipment is usually has a compact form. Accordingly, the removable of the circuit boards would require a huge cost and a long working time. Further, in this document, the remaining circuit boards are simply subjected to innocuous disposal for reclamation after valuables are recovered therefrom, that is, this document fails to disclose the separation and recovery of valuables such as lead contained in solder and noble metal from the circuit boards, and the reutilization thereof as resources.

Meanwhile, if a plastics housing which is one of the components of OA equipment is made of ABS resin or the like, plastics having different specific weights in a narrow range would be mingled together. That is, the specific weight of polystyrene is in the range of 1.02 to 1.51 which is substantially equal to the specific weight (1.03 to 1.09) of the ABS resin. There would be a risk such that different kinds of plastics are sorted into one and the same kind, and recovered. Accordingly, the colors and the materials of the recovered plastics are not uniform, and accordingly, the quality of the recycled resources is low.

BRIEF SUMMARY OF THE INVENTION

A first object of the present invention is to enhance the quality of recovered valuables which are obtained by pulverizing waste including circuit boards, and to restrain diffusion of toxic lead included in the circuit board.

A second object of the present invention is provide an automated process for selecting and separating fragments of circuit boards from fragments of waste other than the circuit boards in order to recover valuables are recovered through the disposal of the waste including the circuit boars.

A third object of the present invention is to enhance the quality of recovered plastics, relating to colors and materials thereof.

The first object of the present invention can be achieved by such an arrangement that a circuit board sorting means for sorting and separating fragments of circuit boards from pulverized waste is provided downstream of a pulverizing means for pulverizing waste including circuit boards. That is, although it is difficult to separate fragments of circuit boards from nonferrous metals and plastics through eddy current classification or gravity concentration, with the provision of the circuit board sorting means for sorting and separating fragments of circuit boards, the amount of fragments of circuit boards mingled into nonferrous metals and plastics can be restrained. As a result, the qualities of nonferrous metals and plastics which are valuables to be recovered, can be enhanced. Further, with the provision of the circuit board sorting means, since waste including circuit boards can be directly pulverized by, for example, the pulverizing means, and accordingly, the necessity of handwork for disassembly can be eliminated, thereby it is possible to reduce the processing time for recovering circuit boards and the processing cost.

In this case, it is preferable to arrange the circuit board sorting means upstream of a nonferrous metal sorting means for sorting nonferrous metals. With this arrangement, it is possible to restrain fragments of circuit boards from being mingled into nonferrous metals. Further, since the fragments of circuit boards are separated, it is possible to apply eddy current for sorting nonferrous metals. Similarly, the circuit board sorting means is preferably provided upstream of a plastic sorting means for sorting plastics. With this arrangement, it is possible to restrain fragments of circuit boards form being mingled into plastics, and to apply gravity concentration for sorting plastics into different kinds.

Further, since fragments of circuit boards are sorted and separated, toxic lead can be separated and recovered, thereby it is possible to prevent diffusion of toxic lead. Further, noble metals contained in circuit boards can be separated and recovered. Further, since circuit boards includes, in general, glass fibers impregnated with resin, the quantity of dust to be reclaimed can be reduced by decomposing the resin so as to recover oil or the like contained therein.

A second object of the present invention is to provide a circuit board sorting means adapted to identify fragments of circuit boards in accordance with colors of circuit boards in order to solve the above-mentioned conventional problems. That is, since the color of circuit boards is, in general, green or brown, the fragments of circuit boards can be separated from other waste. Specifically, fragments are passed through the field of vision of a TV camera or a CCD camera which can therefore pick up images therefrom. Then colors of the picked-up images are compared in contrast with one or a plurality of specific colors which have been previously set in order to determine whether the fragments are those of that other than the circuit boards so as to identify fragments of circuit boards among fragments of other waste, and accordingly, the fragments of circuit boards are mechanically separated from those of other waste.

Specifically, the circuit board sorting means may be composed of an array means for arraying the fragments, being spaced from one another, in a row, and an image pick-up means such as a CCD camera for picking up images from the fragments, and an identifying means for comparing colors of images picked up from the fragments in contrast with one or a plurality of preset specified colors so as to determine whether fragments are those of the circuit boards or other waste. The array means may be composed of conveying means such as belt conveyers having a V-like sectional shape and coupled together in multiple stages in such a way that the speeds of the conveying means are higher and higher successively, and means for introducing fragments of wastes including fragments of circuit boards onto the conveying means. The circuit board identifying means may be composed of a computer or the like.

A circuit board separating means for separating fragments of circuit boards from those of other waste tracks those fragments which are sorted by the circuit board sorting means, during conveyance of arrayed fragments on a conveying path, and drops fragments of circuit boards from the conveying path at a position where the fragments of circuit boards are collected. Specifically, a ring-like fragment receiving part which is defined by an inner and an outer peripheral wall is formed on a rotatable circular table, and the outer peripheral wall is composed of several openable and closable doors which are circumferentially arranged, being adjacent to one another. The fragments discharged from the sorting means are shifted one by one onto the fragments receiving part while the circular table is rotated. Further, there is provided an image pick-up means for picking up images from the fragments having been shifted onto the fragment receiving means. The circuit board separating means determines whether a fragment is one of those of circuit boards or not in accordance with the thus picked-up image delivered from the image pick-up means. If it is a fragment of circuit boards, the position where the fragment of circuit board is located is stored in memory, in relation to the associated door. When the door comes to predetermined collecting position, a signal is delivered to a means for opening and closing the associated door in order to open the door, and accordingly, the fragment is dropped from the circular table under centrifugal force so as to separate the fragments from the other waste. It goes without saying that the above-mentioned separating means can be used for separating not only fragments of circuit boards but also those which can be identified through their picked-up images. Thus, the fragments which are conveyed on the circular table can be separated under centrifugal force, desired fragments can be separated at a high rate from a huge number of fragments of waste. That is, the method disclosed in the Japanese Laid-Open Patent No. H6-23328, using a separating device in which parts are conveyed along a predetermined conveying path by a rotary part feeder composes of a bowl and a rotatable table, then kinds of parts are determined in accordance with an image from a CCD camera, and air is blown onto these parts in order to sort the parts into different kinds and a method disclosed in the Japanese Laid-Open Patent No. H9-201572, including steps of extending a piston toward a cullet on a disc on rotation, and sucking air through a pipe line provided at the forward end of the piston so as to hold the cullet, and sorting parts into different kinds in accordance with colors with the use of images obtained by a CCD camera, would not be suitable for sorting a huge quantity of waste.

A third object of the present invention is to provide a method such that plastic parts including a housing constituting an OA equipment are wrecked, and a color and a material of the part are measured so as to sort recovered plastics into different kinds in accordance with the color and the material, in order to solve the above-mentioned problems. That is, it is possible to enhance the quality, such as a color and a material of thus recovered plastics.

DETAILED DESCRIPTION OF THE INVENTION

Figure 1:
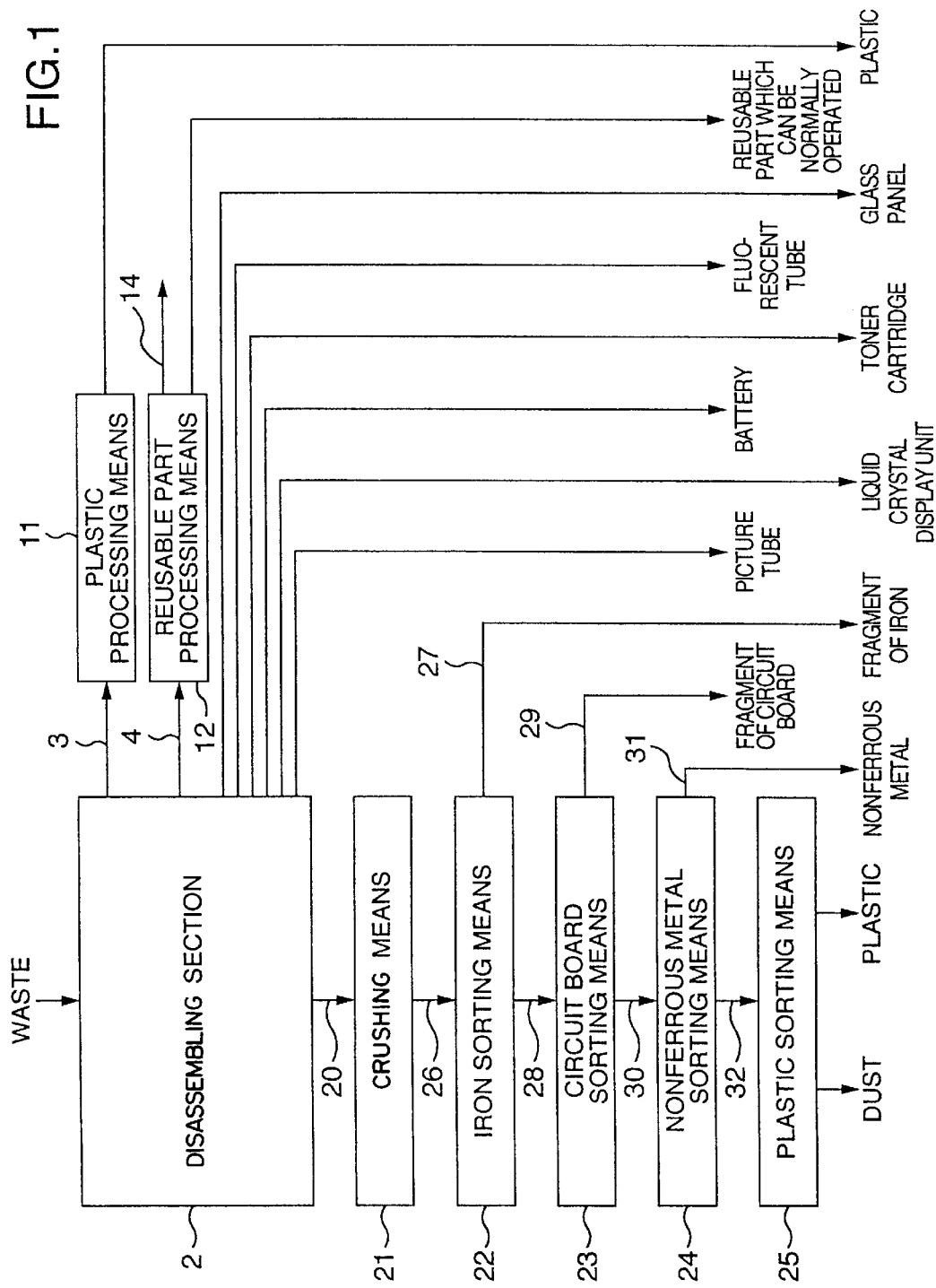
FIG. 1 is a block diagram illustrating an embodiment of a waste disposal apparatus according to the present invention.

Explanation will be hereinbelow made of an embodiment of the present invention with reference to the accompanying drawings. Referring to FIG. 1 which shows a general configuration of a waste disposal apparatus according to the present invention, waste 1 including OA equipment is introduced into a wrecking section 2 where it is wrecked manually with the use of tools including pliers and drivers. It is noted that the OA equipment to be wrecked includes a desk-top personal computer, a notebook-type personal computer, a display unit, a printer, a copier, a facsimile machine and the like.

The desk-top personal computer is composed of a housing, a frame, circuit boards, a power source, a hard disc unit, a floppy disc unit, a battery and the like. The housing is formed of iron or plastic (ABS resin or polycarbonate), and the frame is made of iron. The circuit boards includes a mother board composed of a board part made of epoxy resin, wiring made of copper, legs or leads of elements of electronic parts, made of iron, gold (in a CPU and sockets), silver (in a CPU and sockets). The power source is composed of a plastic housing, copper coils and the like. The hard disc unit and the floppy disc unit are made of aluminum or iron, and the battery is made of iron, carbon and lead.

The notebook type personal computer is similarly composed of a housing, a frame, circuit boards, a power source, a hard disc unit, a floppy disc unit, a battery, a liquid crystal display unit and the like. The housing is made of a plated plastic (ABS resin, polycarbonate or nylon), and the liquid display unit is formed of glass and liquid crystal. The remainder are similar to the desk-top personal computer as mentioned above.

The display unit is composed of a picture tube made of glass, lead and iron, a housing made of plastic (ABS resin or polycarbonate), a frame made of iron, a circuit board composed of a board part made of epoxy resin, wiring made of copper, legs of elements made of iron, and a power source formed of plastic and copper.

The printer is composed of a housing made of iron or plastic (ABS resin or polycarbonate), a frame made of iron, a circuit board composed of a board part made of epoxy resin, wiring made of copper, leg or leads of elements made of iron, and a CPU and sockets made of gold or silver, a power source composed of a housing made of plastic and coils made of copper, and a toner cartridge formed of iron and toner.

The copier is composed of a housing made of iron or plastic (ABS resin or polycarbonate), a frame made of iron, a circuit board composed of a board part made of epoxy resin, wiring made of copper, leg or leads of elements made of iron, and a CPU and sockets made of gold or silver, a power source composed of a housing made of plastic and coils made of copper, a toner cartridge formed of iron and toner, and a fluorescent tube made of glass and mercury, and a glass panel.

The facsimile machine is composed, similar to the copier.

The OA equipment introduced into the wrecking section, plastic parts 3 including a plastic housing, which are relatively large so as to be simply separated, reusable parts 4 which have been previously specified, a battery 5, a picture tube 6, a liquid crystal display unit 7, a toner cartridge 8, a fluorescent tube 9, a glass panel 10 are removed. The thus removed battery 5, the picture tube 6, the liquid crystal display unit 7, the toner cartridge 8, the fluorescent tube 9 and the glass panel 10 are recovered as valuables while the plastic parts 3 is sent to a plastic part disposing means 11, and the reusable parts 4 are sent to a reusable part processing means 12 so that they are processed in respective ways. The plastic part disposing means 11 sorts plastics into different kinds in accordance with their colors. Accordingly, plastics 15 can be recovered with colors and materials which are uniform. Further, the reusable part processing means 12 sorts the reusable parts into inferior reusable parts 14 which malfunction, and reusable parts 17 which can properly function. The reusable parts 17 are cleaned up so as to remove dirt therefrom in order to enhance the buying eagerness of the consumer.

Further, as to the recovered picture tube 6, a front glass panel and a rear glass funnel are separated from each other so as to recover a mask made of iron, and lead, which are then recycled into resources. The housing of the battery is decomposed so as to recover iron and lead which are recycled into resources. The liquid crystal display unit 7 is made to be innocent through incineration or the like. The toner cartridge 8 is disassembled so as to withdraw toner for being reused or recycled into resources. As to a photosensitive drum, a photosensitizer such as selenium, with which the outer surface of the drum is coated thereover, is peeled off from the drum, and is then recycled into resources while aluminum from the drum is reused or recycled into resources, and iron therefrom is pulverized, sorted and recovered in order to be recycled into resources. As to the fluorescent tube 9, glass and mercury are separated and recycled into resources. The glass panel is recycled into resources.

Meanwhile, the remaining waste 20 after wrecking in the wrecking section 2 is fed through a pulverizing means 21, an iron sorting means 22, a circuit board sorting means 23, a nonferrous metal sorting means 24 and a plastic sorting means 25, successively so as to be processed thereby. The pulverizing means 21 which is composed of a crusher or the like, pulverizes the remaining waste 20 conveyed from the wrecking section 2 into fragments having sizes of less than 100 mm, preferably 3 to 5 cm, and sends the thus obtained fragments into the iron sorting means 22. Further, inferior reusable parts 14 which malfunction are also conveyed into the pulverizing means 21 in accordance with a result of processing by the reusable part processing means 12, as will be explained latter.

The iron sorting means 22 incorporates a magnetic separator for sorting ferromagnetic iron with the use of electromagnets with which iron fragments 27 included in fragments 26 of the waste are separated and recovered. The iron fragments 27 includes iron fragments of frames and housing. It is preferable to use a suspended magnetic separator in the iron sorting means, being arranged just above a conveying part on which the fragments of waste is conveyed. Should a magnetic separator of a magnetic drum type be used, iron of leg parts or leads of circuit elements stuck to the fragments of the circuit boards, would likely to be attracted to the magnets, and accordingly, fragments of circuit boards would be mingled into the iron. However, in the case of the suspended magnetic separator, a magnetic force exerted to these small legs or leads cannot lift up the weights of the fragments of circuit boards, thereby it is possible to restrain the fragments of circuit boards from being mingled in the iron group. On the contrary, due to a similar point of view, it would be desirable to reverse the order of arrangement of the iron sorting means 21 and the circuit board sorting means 21. That is, should fragments of circuit boards have a larger rate of iron which is used for the legs or leads of circuit elements, the fragments would be recovered as iron by the iron sorting means 21. In this case, the circuit board sorting means 23 is arranged upstream of the iron sorting means 21 so as to prevent the fragments of circuit boards from being introduced into the iron sorting means 21 in order to enhance the purity of recovered iron.

The circuit board sorting means 23 receives fragments 28 discharged from the iron sorting means 22, identifies fragments of circuit boards in accordance with their colors with the use of a CCD element or a color sensor, from the other fragments 28, and then separates and recovers them.

The nonferrous metal sorting means 24 is composed of an eddy current separator for separating nonferrous metal with the use of action of eddy current induced through the application of an a.c. magnetic field, and is adapted to sort and separate nonferrous metal fragments 31 from fragments 30 discharged from the circuit board sorting means 23.

The plastic sorting means 25 sorts fragments 32 discharged from the nonferrous metal sorting means 24 with the use of difference specific weight, into different kinds of plastics 33 which are then recovered. That is, the plastic fragments are sorted in accordance with their specific gravities, into different kinds such as polyethylene (having a specific ratio of 0.90 to 0.98), polypropylene (having a specific weight of 0.090 to 0.96), polystyrene (having a specific weight of 1.02 to 1.15), ABS resin (having a specific weight of 1.03 to 1.09), phenol resin (having a specific weight of 1.25 to 1.30), polyvinyl chloride (having a specific weight of 1.33 to 1.44) and epoxy resin (having a specific weight of 1.6 to 2.0). After the plastics are separated, the remainder is processed so as to be wasted as dust 34.

With the embodiment shown in FIG. 1, as mentioned above, since the circuit board sorting means 23 is provided upstream of the nonferrous metal sorting means 24 and the plastic sorting means 25, it is possible to prevent fragments of circuit boards from being mingled into nonferrous metals and plastics to be recovered, and accordingly, the purities of recovered nonferrous metals and plastics can be enhanced so as to enhance the value or recycling. That is, in the case of no provision of the circuit board sorting means 23, the fragments 29 of circuit boards contain copper or the like of wiring, which would possibly be separated and recovered together with nonferrous metals. In this case, nonferrous metals are contained therein with impurities, thereby the value of the nonferrous metals would be lowered.

Similarly, in the case of no provision of the circuit board sorting means 23, when the plastics 33 are sorted, depending upon difference in specific weight, the fragments 29 of circuit boards would be mingled into phenol resin (having a specific weight of 1.25 to 1.30) or polyvinyl chloride (having a specific weight of 1.33 to 1.44) due to affection by shapes of the fragments since the fragments 29 of circuit boards have a specific ratio of 1.6 to 2.0, which is nearly equal to those of phenol resin and polyvinyl chloride, and accordingly, the purities of these plastics are lowered. Thus, the values of the recovered plastics are lowered so that the recycling of the plastics becomes impossible. That is, they should be subjected to waste disposal such as reclamation. In this case, since circuit boars contain toxic substance such as lead, and accordingly, they are made to be innocent or they are reclaimed in a controlled reclaiming area, thereby the disposal costs become inevitably high. These problems can be simply solved by the embodiment, shown in FIG. 1, in which the circuit board sorting means 23 is provided between the pulverizing means 21 and the nonferrous metal sorting means 24, and between the pulverizing means 21 and the plastic sorting means 23, and between the pulverizing means 21 and the plastic sorting means 25 so that the fragments 29 of circuit boards have been removed from the fragments 30, 34 introduced into the nonferrous metal sorting means 24 and the plastic sorting means 25, thereby it is possible to enhance the purities of nonferrous metals, and accordingly, it is possible to enhance the values of recovered items.

Further, with the provision of the circuit board sorting means 23, the waste of OA equipment containing circuit boards can be directly pulverized, and accordingly, the efficiency of the waste disposal can be enhanced. That is, the waste 1 such as a personal computer mainly has, in general, a complicated structure since it is desired to be compact, and accordingly the circuit board can hardly be removed only after the computer is wrecked. The removable of the circuit boards requires a long time so that the cost of the disposal inevitably becomes higher. However, according to the embodiment shown in FIG. 1, with the provision of the circuit board sorting means 23 for sorting and separating fragments of circuit boards among fragments, the time of the disposal can be shortened as to lower the cost. Further, since the circuit board sorting means 23 sorts and separates fragments of circuit boards, the volume of dust 23 to be subjected to waste disposal, can be reduced, thereby it is possible to reduce the cost of the reclamation.

In particular, since the fragments 29 of circuit boards can be separated and recovered, toxic substance such as leads contained in the circuit boards is mixed with sand iron, and then is heated and vibrated in order to be melted and separated for recovery by a process technology disclosed in Japanese Laid-Open Patent No. H9-262573, and further, the resin is thermally decomposed into oil which is then recovered, thereby it is possible to carry out waste disposal which can satisfy the environmental safeguard. In addition, the recovered lead can be recycled into valuables. Further, the fragments 29 of circuit boards are dissolved by aqua regia or nitric acid, and is then electrolyzed in order to recover noble metals such as gold and silver contained in circuit boards, as valuables. In addition, the fragments 29 of circuit boards separated and recovered may be dissolved and solidified in order to cause lead contained in circuit boards, to be innocent.

Detailed explanation will be hereinbelow made of components in the embodiment shown in FIG. 1, with reference to FIGS. 2 to 15.

An Embodiment of the Wrecking Section 2

Figure 2:
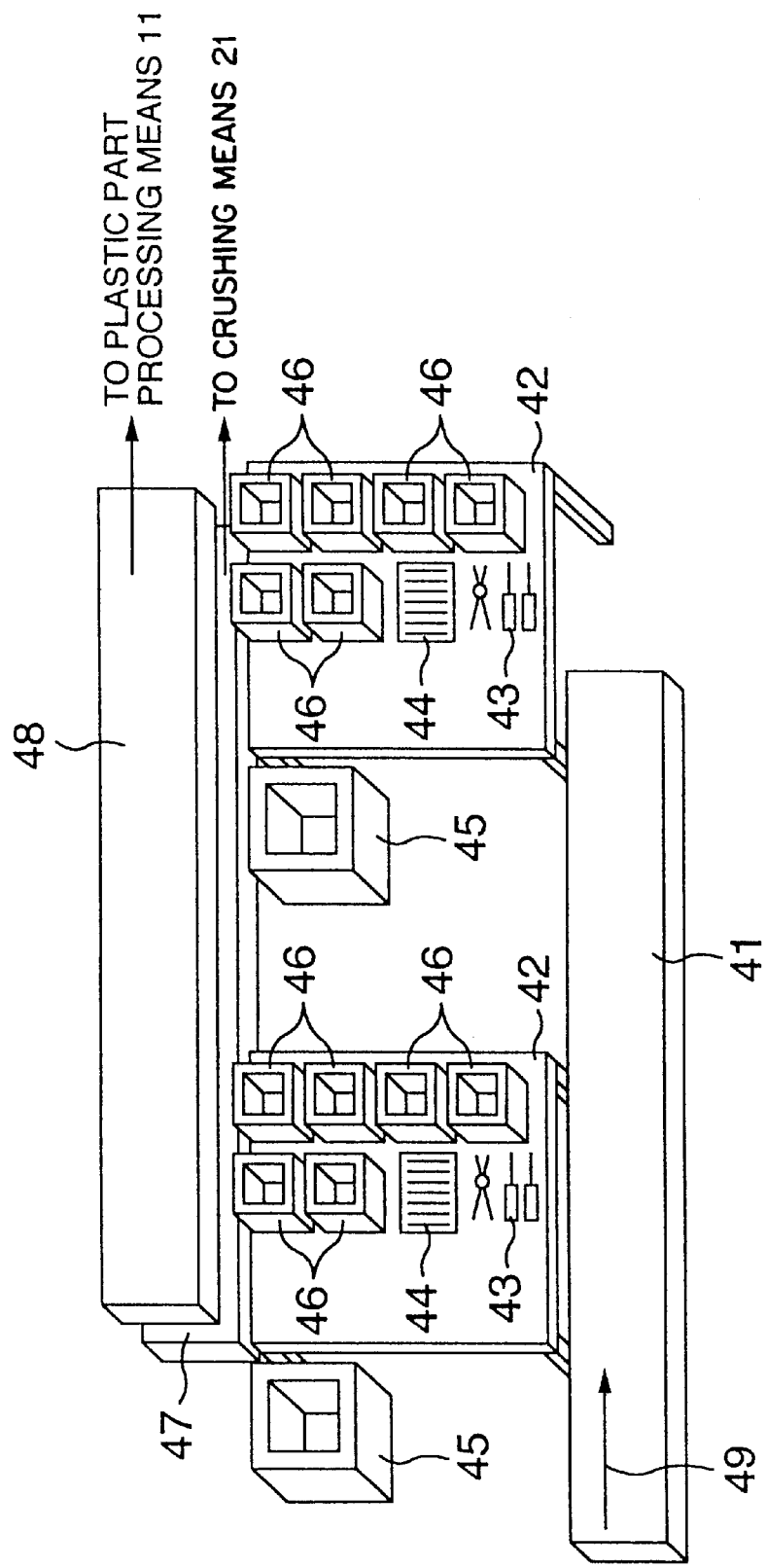
FIG. 2 is a view illustrating an embodiment of a wrecking section.

The wrecking section 2 is, as shown in FIG. 2, composed of a conveying means 41 such as a free conveyer, a working table 42 laid along one side of the conveying means 41, and wrecking tools 43 such as pliers and drivers, a reusable part list 44, a picture tube recovery box 45 set on the working table, and a recovery box 46 for a battery, reusable parts, a liquid crystal display unit, a toner cartridge, a fluorescent tube and a glass panel, which are set on the working table 42, and conveying means 47, 48 such as conveyers. The conveying means 47 is laid along one side of the working table 42 at a level which is lower than the level of the working table 42 by about 1 to 10 cm, and the conveying means 48 is laid along one side of the working table 42 at a level which is higher than the level of the conveying means 47.

Waste transferred in the direction of the arrow 49 by the conveying means 41 is set on the working table 42, and plastic parts such as a plastic housing is removed through wrecking with the use of the wrecking tools 43, and plastic parts are set on the conveying means 48 so as to be fed into the plastic part disposing means 11. Housings other than that made of plastic are set onto a conveying mans 212 so as to be fed into the pulverizing means 104. Similarly, parts 3 listed on the reusable list 44, (that is, reusable parts) are removed with the use of the wrecking tools, and are then set in predetermined recovery boxes 46. These recovered reusable parts 3 are then fed into the reusable part processing means 12. In the case of a display unit having a picture tube, a picture tube 6 is removed and is then set in a picture tube recovery box 45. Similarly, a battery 5, a liquid crystal display unit 7, a toner cartridge 8, a fluorescent tube 9 and a glass panel 120 are removed, and are set in the associate boxes 46, respectively. Thus, the remaining waste after wrecking is carried on the conveying means 47, and is then conveyed into the pulverizing means 21.

As mentioned above, since the carrying surface of the conveying means 47 is laid at a level which is lower than the level of the working table 42 by about 1 to 10 cm, the remaining waste 20 after the parts such as plastic housing are removed, can be set onto the conveying means 47 without lifting the same, thereby it is possible to facilitate the working and to enhance the working efficiency.

Embodiment of the Pulverizing Means 21

Figure 3:
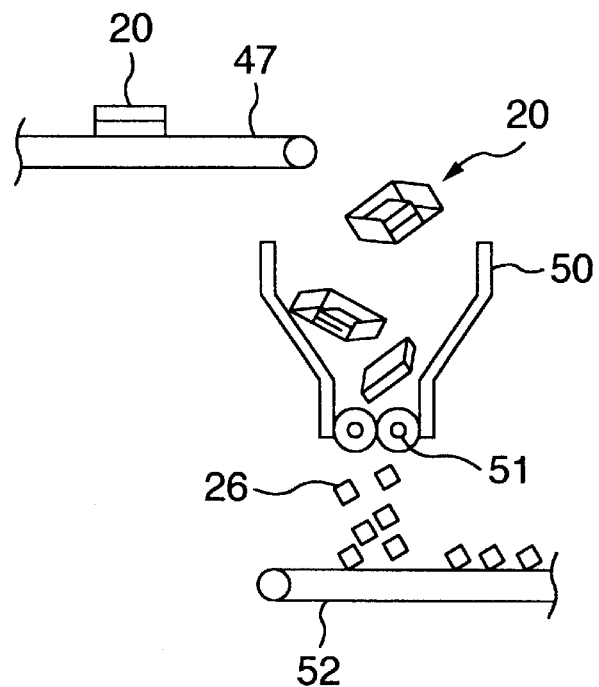
FIG. 3 is a view illustrating an embodiment of a pulverizing means.

Referring to FIG. 3 which is a partly sectioned view illustrating the arrangement of an embodiment of the pulverizing means 21, the waste 20 conveyed by the conveying means 47 is introduced into the pulverizing means 21 where a cutting blade 51 in a crusher 50 is rotated so as to pulverize the waste 20 into fragments 26 having a size of less than 100 mm (preferably in a range of 3 to 5 cm). The fragments 26 are conveyed by a conveying means 52 into the iron sorting means 22.

An Embodiment of the Iron Sorting Means 22

Figure 4:
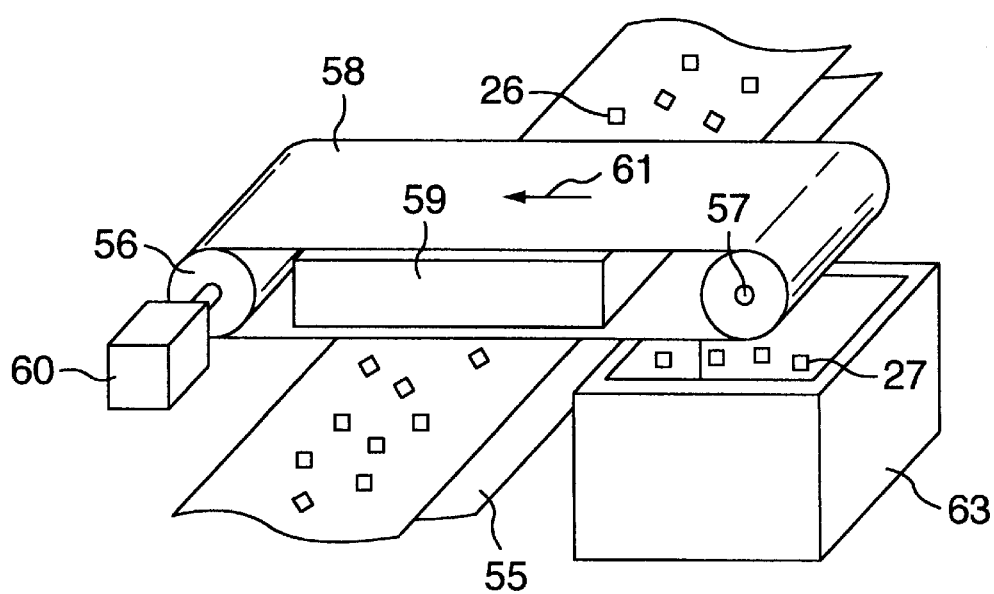
FIG. 4 is a view illustrating an embodiment of an iron sorting means.

Referring to FIG. 4 which is a perspective view illustrating an embodiment of the iron sorting means 22, the iron sorting means 22 is composed of a pair of rollers 56, 57 between which the belt conveyer 55 is interposed, and a belt conveyer 58 wound around the pair rollers 56, 57, and an electromagnet 59 is set above the rear surface of the belt of the belt conveyer 58 which is opposed to the belt conveyer 55. With this arrangement, if some of the fragments 26 of the waste conveyed on the belt conveyer 55 contain iron, those are attracted by the electromagnet 59 so as to be lifted up and attracted to the conveying surface of the belt conveyer 58. Further, the conveying surface of the belt conveyer 58 travels in the direction of the arrow 61 due to the rotation of a motor 60 coupled to the roller 56, and accordingly, the attracted iron steel fragments 27 are conveyed to a position above an iron recover box 63, at which the attracting force of the electromagnet 59 is weakened so as to allow the iron fragments to drop into an iron recovery box 63 so as to be recovered.

An Embodiment of the Circuit Board Sorting Means 23

Figure 5:
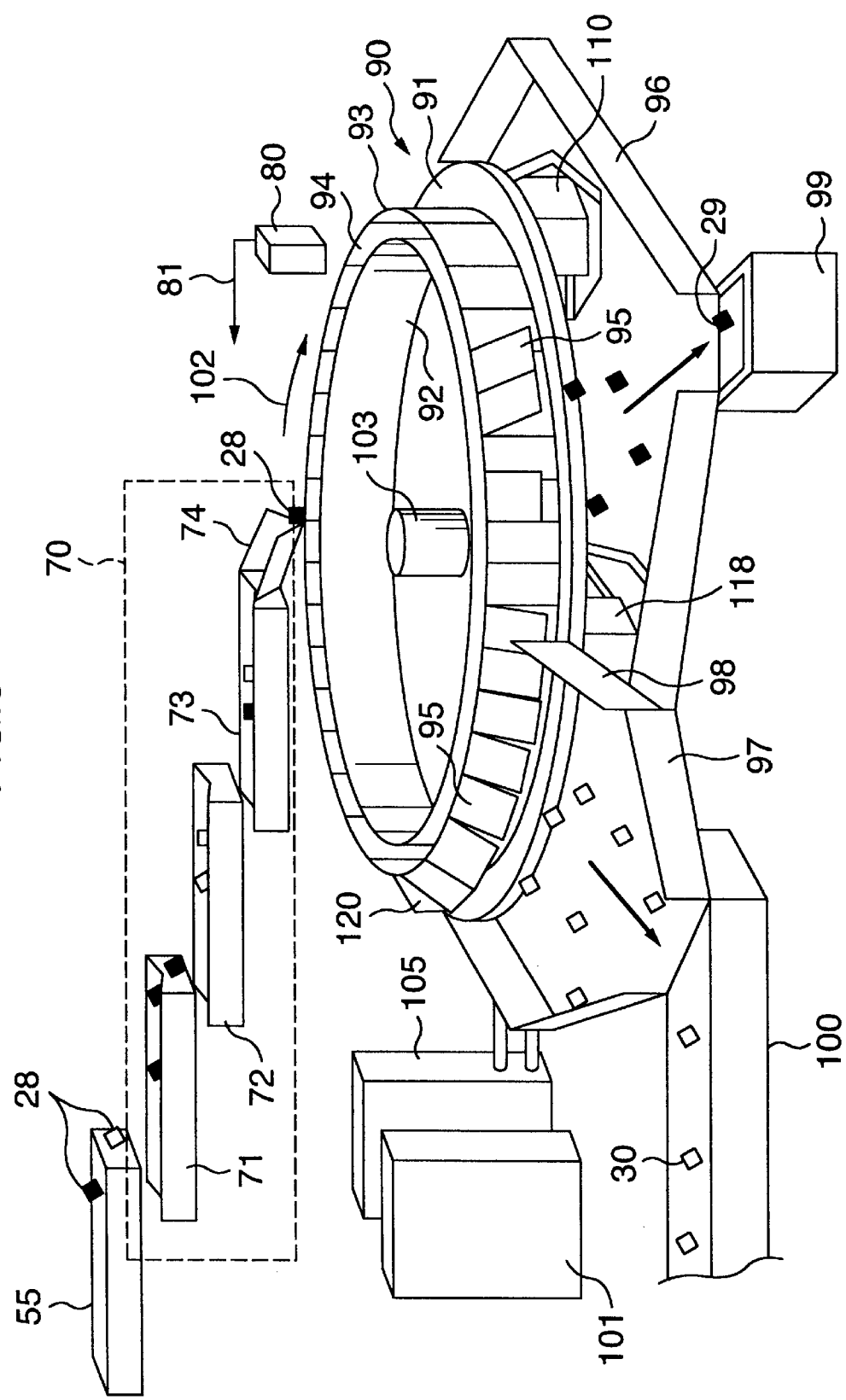
FIG. 5 is a view illustrating a general configuration of an embodiment of a circuit board sorting means.

Referring to FIG. 5 which is a perspective view illustrating a general arrangement of an embodiment of the circuit board sorting means 23, the circuit board sorting means 23 is mainly composed of an array device 70 as an array means, a circuit board identifying device 80 as a circuit board identifying means, a circuit board separating device 90 as a circuit board separating means. The array device 70 is composed of a plurality of belt conveyers 71, 72, 73 each of which has a conveying surface made of rubber and a V-like cross-sectional shape, that is, the center part of the conveying surface is caved, and which are arranged in multiple stages. The conveying speeds of these belt conveyers 71, 72, 73 are set to, for example, 2 m/sec, 4 m/sec and 6 m/sec, respectively, so that their speeds are higher and higher toward the downstream side. Accordingly, the fragments 28 of the waste from which iron is separated and removed are introduced onto the most upstream belt conveyer 71 by means of the belt conveyer 20, and then they are conveyed on the belt conveyers 71, 72, 73, successively, while the fragments 28 are arranged in a row in the conveying direction under action of a V-like belts, at intervals caused by the different conveying speeds. The fragments arranged in a row are fed into the circuit board separating device 90 by way of a chute 74.

The circuit board separating device 90 is composed of a circular rotary table 91 rotatably journalled, and a ring-like fragment receiving part 94 defined on this table 91 between an inner peripheral wall 62 and an outer peripheral wall 63, and the fragments 28 of waste to be separated is introduced into the fragment receiving part 94 from the chute 74. The outer peripheral wall 93 is composed of a plurality of doors 95 which are circumferentially arranged, adjacent to one another, and the doors can be opened and closed by means of the opening and closing mechanism which will be described hereinbelow. Chutes 96, 97 are arranged underneath the peripheral edge part of the rotary table 9, and are isolated from each other by a partition panel 98. A circuit board recovery box 99 is provided at the discharge end of the chute 93, and a belt conveyer 100 is provided at the discharge end of the chute 97. The rotary table 91 is rotated by means of a motor which is not shown, in the direction of the arrow 102. A computer 101 controls the operation of the rotary table 91, the doors 95 and the like.

The circuit board sorting means 80 is composed of a CCD element as an image pick-up means and an image processing device. The CCD element is arranged, confronting the fragment receiving part 94 downstream of the position where the fragments 28 is introduced. An image picked up by the CCD element is taken into the image processing device so that whether a fragment 28 is a fragment 29 of circuit boards or not is determined. This determination is made in accordance with a cooler of the image. That is, since the circuit boards have, in general, a green color or a brown color, specific colors have been previously stored in memory in the image processing device, and the color of the image of the fragment is compared in contrast with the specified colors so as to determine whether the fragment 28 is one of the fragments 29 of circuit boards or not. If it is determined that the fragment 28 is one of the fragments 29 of circuit boards, a circuit board detection signal 81 is delivered to the computer 101. Conventional color image processing technologies for comparing the color of the image in contrast with the specified colors so as to determine an object to be identified as disclosed in Japanese Laid-Open Patent No. H07-021375 and Japanese Laid-Open Patent No. H06-208621 can be used.

The computer 101 receives a rotating phase of the rotary table 91 from a rotary encoder engaged with a rotary shaft 106 of the rotary table 91 when the circuit board detection signal 81 is received, and stores in memory an identification mark of a door 95 corresponding to the rotating phase with which a fragment 29 of circuit boards is detected. Further, by tracking the position of the door 95, and when the door comes to, for example, the chute 96, an opening instruction is delivered to the opening and closing mechanism for the door 95 which is therefore opened. Thus, the fragment 29 of circuit board received in the fragment receiving part 94 is dropped from the rotary table 91 under centrifugal force. With this arrangement, the fragment 29 of circuit boards is stored in the circuit board recovery box 99, being separated from the fragments 30 of the remaining waste.

Figure 6:
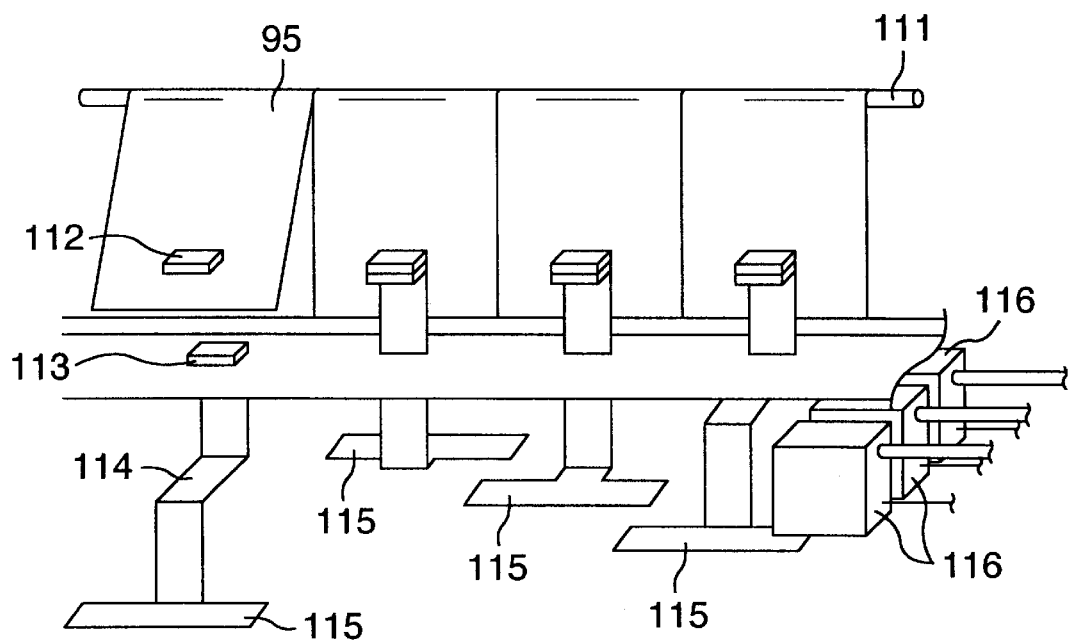
FIG. 6 is a view illustrating an embodiment of a door opening means in the circuit board sorting means shown in FIG. 5.

Next, explanation will be hereinbelow made of an example of the opening and closing mechanism in detail, with reference to FIGS. 5, 6, 7 and 8. The opening mechanism in this embodiment is composed of a door opening means 110, an all door closing means 118 and a door closing means 120, as shown in FIG. 5. Referring to FIG. 5, the chute 96 is, in part, cut off in order to show the door opening means and the all door opening means 118. As shown in FIG. 6, the door 95 can be opened and closed by swingably attaching the upper end part thereof to a support shaft 111 formed in a ring-like shape. A magnetic protrusion 112 is projected from the outer surface of the door 95, and a stopper 114 having a magnet whose shape corresponding to the protrusion 112 is extended through the rotary table 91 so as to be vertically movable. Further, a planar actuating panel 115 is provided at the lower end of each stopper 114. This planar actuating panels 115 are periodically arranged over the entire periphery, each three adjacent planer actuating parts 115 being positionally shifted, radially of the rotary table 91. Further, three solenoid valves 116 for jetting compressed air onto the upper surfaces of the actuating panels 115 are provided at three positions where the actuating panels 115 pass through. This compressed air is fed from an air compressor 105 shown in FIG. 5. The solenoid valves 116 jets the compressed air onto the associated actuating panels 15 in response to a door opening instruction delivered from the computer 105, and accordingly, the magnets 113 are pulled off from the protrusions 112 so that the stoppers 114 drops downward. As a result, the swinging of the doors can be freely made, and accordingly, the doors 95 are opened under a centrifugal force due to rotation of the rotary table 19, and the fragments 29 of circuit boards are discharged from the fragment receiving part 94 onto the chute 96 also under the centrifugal force, and accordingly, the fragments 29 of circuit boards can be separated from the fragments 30 of the remaining waste. Further, when the doors pass by the partition panel 98 through the rotation of the rotary table 91, the solenoid valves of the all door opening means 118 are energized so as to depress all stoppers 114 in order to all fragments 30 remaining in the fragment receiving part 94 are dropped into the chute 97. With this arrangement, the fragments 30 other than the fragments 29 of circuit boards are conveyed by means of the conveyer 100.

Figure 7:
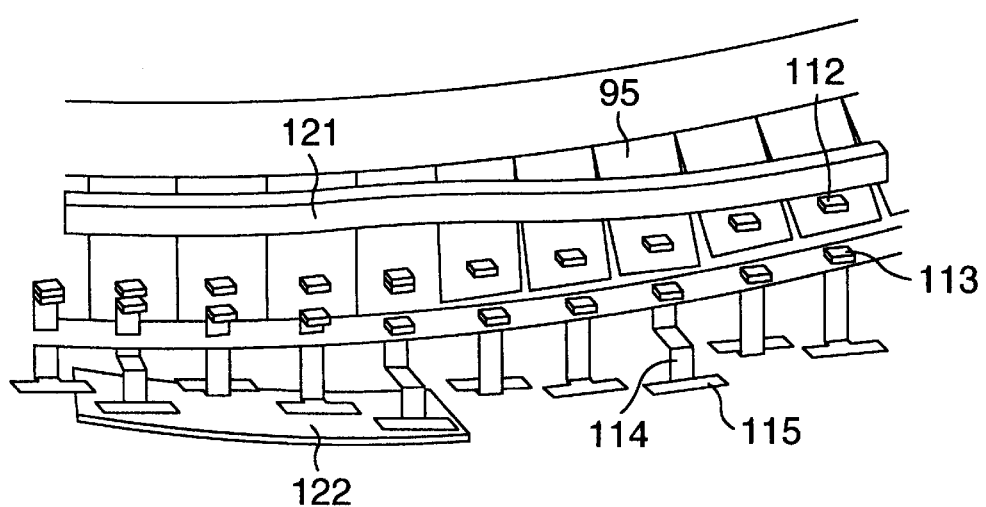
FIG. 7 is a view illustrating an all door closing means and a stopper returning means in the circuit board sorting means shown in FIG. 5.

Referring to FIG. 7 which shows a door closing guide 121 and a stopper retuning guide 122 which constitute the door shut-off means 120. The door closing guide 121 is arranged at the upper parts of the outer peripheral side of the doors 95, gradually approaching the outer surfaces of the doors from a position distant from the outer surfaces of the doors, and accordingly, the doors 95 are automatically closed as the rotary table 91 is rotated. The stopper returning guide 122 is formed by a slope panel provided under the position where the actuating panels 115 of the stopper pass by. With this arrangement, the stoppers 114 are automatically pushed up as the rotary table 61 is rotated so as to cause the magnets 113 to be attracted to the protrusions 112.

In the above-mentioned embodiment of the circuit board sorting means 23, the speed of the rotary table 91 at the position of the fragment receiving part 94, is set to be 6 m/sec, images of the fragments are picked up by the image pick-up means such as the CCD element, at a rate of 60 frames per second, and the circuit board identification by colors are carried out at a rate of 60 frames per second. Accordingly, the fragments of circuit boards can be smoothly identified among fragments of waste to be conveyed on-line, and can be sorted and separated. Further, in this case, the opening time of each solenoid valves is set to about 10 mse. For example, the time required for opening the solenoid valves is, in general, 8 to 15 msec, and the time required for closing the solenoid valves is 15 to 20 msec. Thus, if the method of directly blowing jetted air onto the fragments, from the solenoid valves is used, and if the valve opening time is set to 25 msec, the critical sorting speed is 16 to 20 per second. In view of this point, according to the above-mentioned embodiment, the stoppers 114 are operated by three solenoids 116 so as to open the doors 95, the fragments can be sorted and separated at a speed of 60 per second. Thus, the fragments are carried on the rotary table, being lined up in a row, and are separated with the use of a centrifugal force, and accordingly, desired fragments can be separated from fragments of a huge quantity of waste, at a high speed, in comparison with a conventional separating device.

Further, if the number of the solenoid valves is increased from three, the processing speed can be increased from 60 per second. Accordingly, the processing volume per unit time can be increased while the running cost per unit time is held to be constant, thereby it is possible to lower the running cost. Further, due to a huge processing volume, the fragments of circuit boards cam be separated on-line from fragments discharged from the pulverizing means.

Further, if two conveyers are use in the array means 70 while the conveying speeds of these conveyers are set to 1 m/sec and 2 m/sec, respectively, and if the processing speed of the circuit board identifying device 80 is set to 20 frames/sec while the number of the solenoid valves 116 is set to two, the processing speed may be set to 20/sec. Accordingly, the number of the conveying means can be reduced and the diameter of the rotary table 91 can be decreased. Further, the output power of the motor for driving the rotary table can be reduced. Similarly, if the array means 70 is composed of a conveyer having a conveying speed of 1.5 m/sec and a conveyer having a conveying speed of 3 m/sec, and the processing speed of the circuit board identifying deice 80 is set to 30 frames/second while the number of the solenoid valves 16 is set to 2, the processing speed may be set to 30/sec.

Further, the fragment receiving part 94 may be circumferentially divided into a plurality of sections in accordance with the number of the doors. With this arrangement, it is possible to prevent an introduced fragment from spanning between two doors, and accordingly, the fragments can be simply separated from one by one. As a result, it is possible to reduce the possibility of simultaneous recovery of both one of the fragments 29 of circuit board and one of the fragments of the remaining waste.

A Variant Form of the Circuit Board Sorting Means 23

The above-mentioned circuit board identifying device can be used for sorting any of objects to be sorted, irrespective of circuit boards. For example, with the use of the circuit board identifying device 80, wire-like objects are sorted in accordance with an image picked up from the objects to be sorted, that is, fragments of covered copper wires, other than those of circuit boards may be sorted. That is, an image of a fragment is extracted from an image due to a color different from that of the background, so as to measure a width and a length of the image of the fragment if the width or the length is shorter than 2 mm, the fragment is determined as a covered copper wire. In order to separate and recover it from other fragments, the opening of the door is controlled by the computer 101, similar to the separation of the fragments of circuit boards, the covered copper wire can be sorted. Thus, since the covered copper wire is recovered, it is possible restrain copper wires from mingled into the nonferrous metals 31 and the plastics 33 which are recovered by the nonferrous metal sorting means 24 and the plastic sorting means. Further, the mechanism of the door opening means 110 is changed in accordance with a number of objects to be separated, and the numbers of the chutes 96 and the partition panels 98 are suitably increased. Similarly, the with the use of the circuit board identifying device 80, valuables such as copper or brass are sorted in accordance with colors, and are separated by the circuit board separating device 90, the valuables including copper or brass can be sorted at a high speed.

Similarly, in the circuit board identifying means, an infrared beam is irradiated onto objects to be sorted, and an infrared spectrum is measured from the reflection thereof so as to identity a material in order to recover rubber and wood. Further, with the use of wind force sorting, paper can be sorted. With this arrangement, it is possible to restrain rubber, wood and paper from being mingled into the nonferrous metals or the plastics.

A Variant Form of the Circuit Board Separating Device 90

Figure 8:
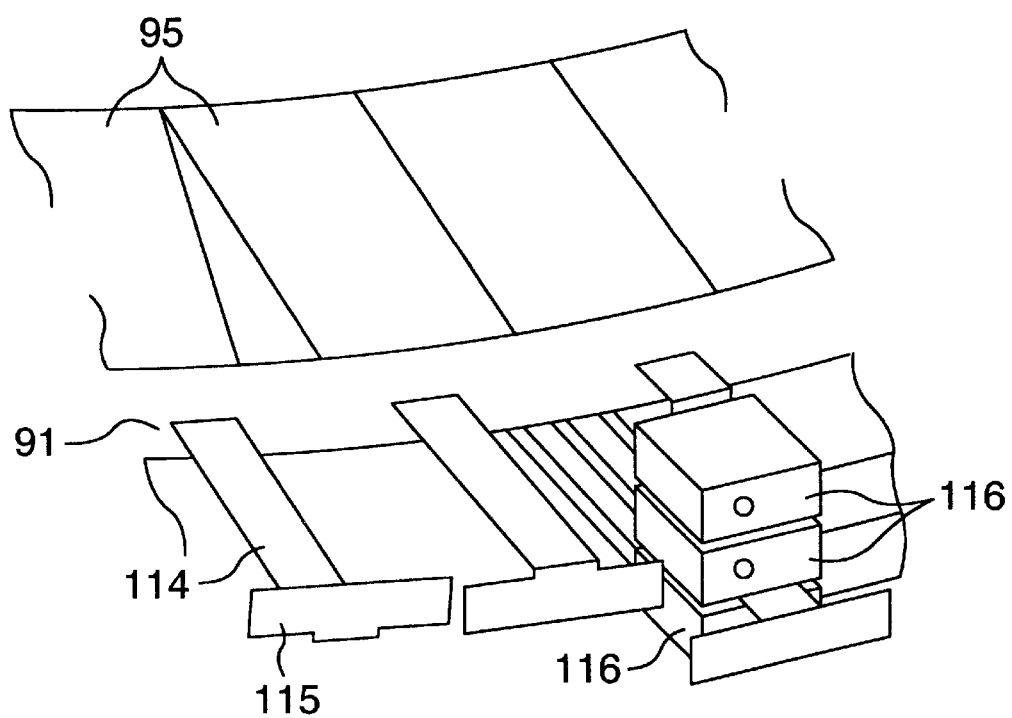
FIG. 8 is a view illustrating another embodiment of the door opening means in the circuit board sorting means shown in FIG. 5.

Instead of the opening and closing structure of the door and the door opening means 110 shown in FIGS. 5, 6, as shown in FIG. 8, the base surface of the rotary table 91, corresponding to the bottom surface of the fragment receiving part 94 which is not shown, is formed therein with an opening, and a door 95 having such a structure that the door 95 is opened downward around the center side of the rotary table as a fulcrum, is provided to the opening. With this arrangement, a fragment is dropped onto the chute from the opening under centrifugal force. In this case, the stoppers 114 are arranged so as to be extendable underneath the door 95 toward the center from the outer peripheral surface of the rotary table 91, and air is jetted from the solenoid valve 116 in a direction in which the stopper 114 is extended, onto an actuating panel 115 provided to the front end of each of the stoppers 114. Further, the door closing guide 121 shown in FIG. 7 is provided underneath the rotary table 91, and the stopper returning guide 122 is provided in the outer peripheral side of the rotary table 91.

Another Embodiment of the Circuit Board Sorting Means 23

Figure 9:
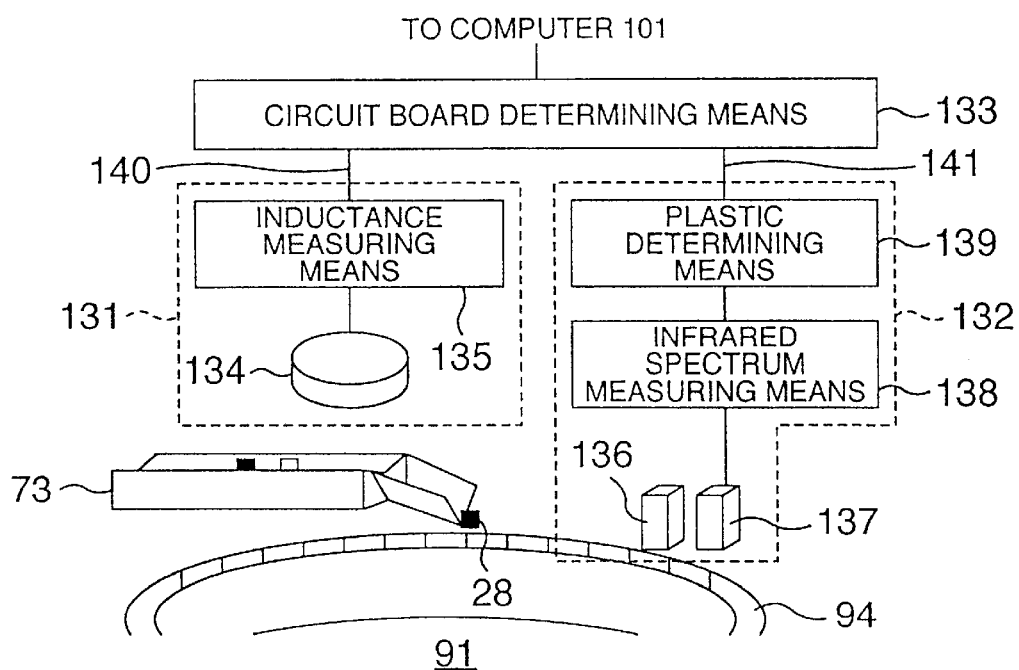
FIG. 9 is a view illustrating further another embodiment of the circuit board sorting means shown in FIG. 5.

Referring to FIG. 9 which is a schematic view illustrating another embodiment of the circuit board sorting means 23, the circuit board separating device 90 is the same as that shown in FIG. 5, but the circuit board sorting means is alone different. The circuit board identifying means in this embodiment is composed of a magnetic element detecting means 131, a plastic sorting means 132, and a circuit board determining means 133, and the magnetic element detecting means 131 is composed of a coil 134 and an inductance measuring means 135 while the plastic sorting means 133 is composed of a light source 139, a light receiver 137, an infrared spectrum measuring means 138 and a plastic determining means 139. The circuit board determining means 133 is connected to the computer 101. A coil 134 is arranged above the final stage belt conveyor 73. The light source and the light receiver 137 are arranged above the fragment receiving part 94 of the rotary table.

Explanation will be hereinbelow made of the detailed structure and the operation of the thus constituted circuit board sorting means 80. At first, the inductance measuring means causes a.c. current to run through the coil 134 so as to generate an a.c. magnetic field. With this arrangement, if a magnetic element is included in fragments conveyed by he belt conveyer 73, eddy current is induced in the fragment containing the magnetic element when the fragment passes underneath the coil 134 due to an a.c. magnetic field. This eddy current causes the a.c. magnetic field to vary so that current running through the coil 134 varies. The variation of the current is measured by the inductance measuring means 135 in order to measure a variation in the inductance of the coil 134. If the variation of the inductance exceeds a set value, it is determined that a fragment containing a magnetic element, and a magnetic element detection signal 140 is delivered to the circuit board determining means 133.

Meanwhile, as the light source 136, a ceramic light source which emits a near infrared beam. A near infrared spectrum means 138 extracts light received by the light receiver 13 which receives reflected light which is obtained by light emitted from the light source and reflected by a fragment or the rotary table 91, so as to measure an intensity of the received light in a near infrared range. A difference between the measured intensity of the light in the near infrared range, and a light intensity which has been previously measured, is calculated so as to obtain a near infrared spectrum which is then delivered to the plastic determining means 139. The plastic determining means 139 integrates the difference between the near infrared spectrum obtained by the measuring, and near infrared spectra of epoxy resin and phenol resin in the direction of the wave number, and compares the integrated value with a predetermined threshold value. If the integrated value is smaller than the threshold value, it is determined that the fragment is made of epoxy resin or phenol resin, and a resin detection signal 141 is delivered to the circuit board determining means 133.

If the circuit board determining means 133 receives the magnetic element detection signal 140 and the resin detection signal 141, it determines that the fragment is one of the fragment 29 of circuit board, and delivers a circuit board detection signal to the computer 101.

That is, in this embodiment, in view of such a fact that the fragments of circuit boards contain copper or iron which are magnetic, and epoxy resin or phenol resin, the fragments 29 of the circuit board are detected by the above-mentioned method in addition to the method of identifying the fragments of circuit boards in accordance with colors.

Further, in the plastic determining means 139, epoxy resin or phenol resin can be identified even though the methods disclosed in Japanese Laid-Open Patent No. H6-308022 and Japanese Laid-Open No. H8-300354 are used.

An Embodiment of the Nonferrous Metal Sorting Means 24

Figure 10:
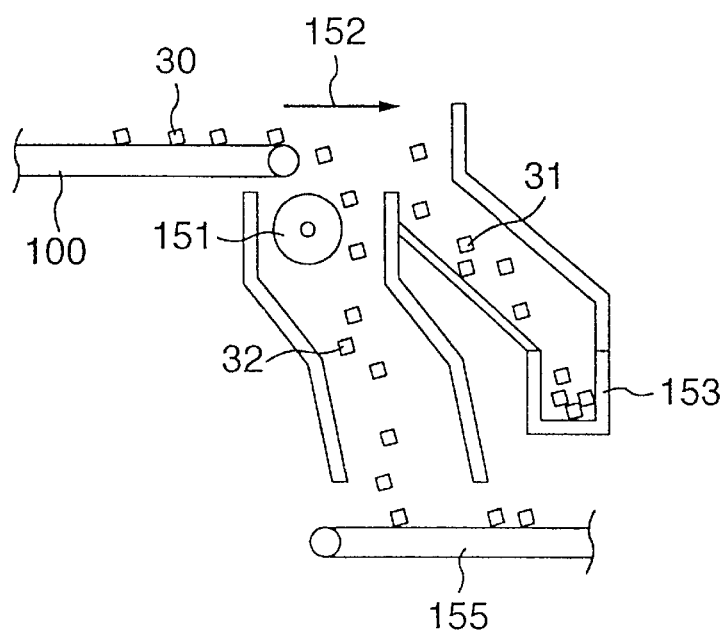
FIG. 10 is a view illustrating an eddy current sorter as an example of a nonferrous metal sorting means.

Referring to FIG. 10 which is a sectional view illustrating an embodiment of the nonferrous metal sorting means 24, fragments 30 conveyed on a belt conveyer 100 is fed above a rotating magnet 151. Accordingly, if nonferrous metal is contained in the fragments 30, eddy current is induced in the nonferrous metal. A magnetic field induced by the eddy current and a magnetic field induced by the rotary magnet 151 are repulsive with each other, and accordingly, a fragment containing the nonferrous metal are ejected in the direction of the arrow 152 so as to be separated from the remaining fragments 32. Further, fragments 31 are recovered into a nonferrous metal recovery box 153, and the fragments including plastics and dust are conveyed into the plastic sorting means 25 by the belt conveyor 15.

An Embodiment of the Plastic Sorting Means 25

Figure 11:
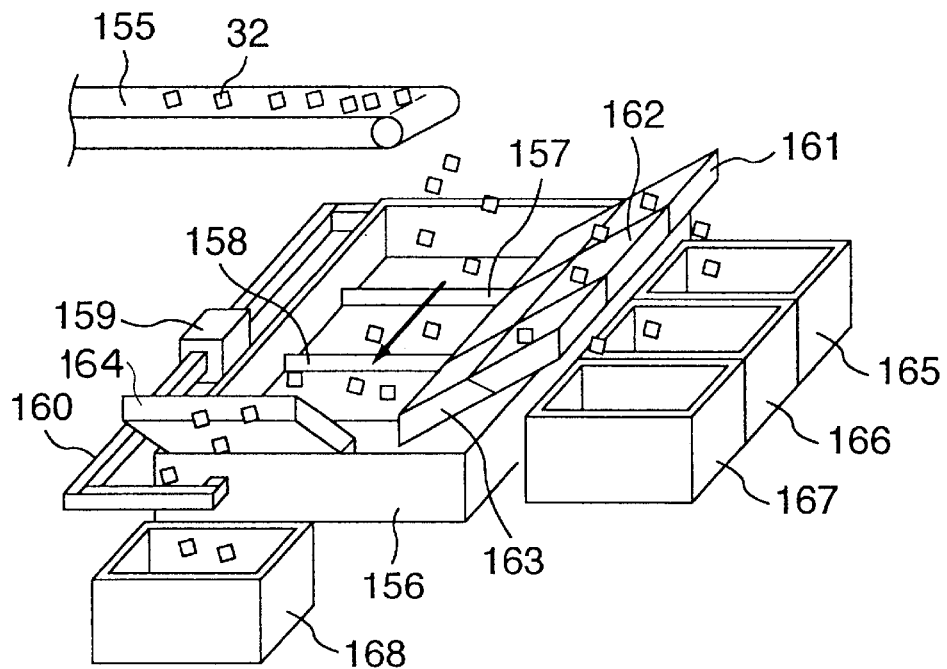
FIG. 11 is a view illustrating an example of a gravitation concentration machine as an example of a plastic sorting means.

Referring to FIG. 11 which is perspective view illustrating an embodiment of the plastic sorting means 25, the plastic sorting means 25 is composed of a water tank 156 filled therein with water, a plurality of partition panels 157, 158 laid in the water tank 156, a pump 159 and a pipe line 160 by which water is sucked into the water tank 156 on the upstream thereof and is then discharged to the opposite side from the tank 156 on the opposite side thereof, three conveyers 161, 162, 163 for scarping up fragments sunk into three isolated sections defined by the partition panels 157, 163, a conveyer 164 for taking up fragments floated in the water tank 156, and plastic recovery boxes 165, 166, 167, 168 which are arranged corresponding to these conveyers.

With this arrangement, the water from the water tank 156 is circulated through the pipe line 10 by means of the pump 159 so that the water in the water tank 156 flows in the direction of the arrow. In this case, when the fragments 32 conveyed on the conveyer 155 are introduced into the most upstream section of the water tank 156, epoxy resin having a high specific weight (1.6 to 2.0) and dust are settled onto the conveyer 161 in the section where the fragments are introduced, without overriding the partition panel 157 since the settling velocities thereof are high, and are then recovered into the plastic recovery box 165. Phenol resin having a secondary small specific weight (1.25 to 1.30) and polyvinyl chloride resin having a specific weight (1.25 to 1.44) overrides the partition panel 157 so as to be settled in the section between the partition panels 157, 158, and recovered into a plastic recover box 166 by means of the conveyer 162. Further, polystyrene having a smaller specific weight (0.90 to 0.98) and polypropylene having a smaller specific weight (0.90 to 0.96) are lighter than water, and accordingly, it is left to be floated on in the water so as to be directly recovered into a plastic recovery box 168 by means of the conveyer 168. It is noted that the number of the partition panels 157, 158 should not be limited to two, but the number may be increased so as to finely sort the plastics in accordance with different specific weights. For example, the phenol resin and the polyvinyl chloride are separated from each other and are then recovered, respectively.

An Embodiment of a Plastic Part Disposing Means 11

The plastic part disposing means 11 identifies colors and materials (ABS resin, polycarbonate, nylon and the like) so as to sort the plastic parts 3 in accordance with colors and materials. The plastic parts 3 are recovered in accordance with colors or materials. The plastic parts which are sorted in accordance with colors or the materials are pulverized and recovered in view of respective colors or materials.

Figure 12:
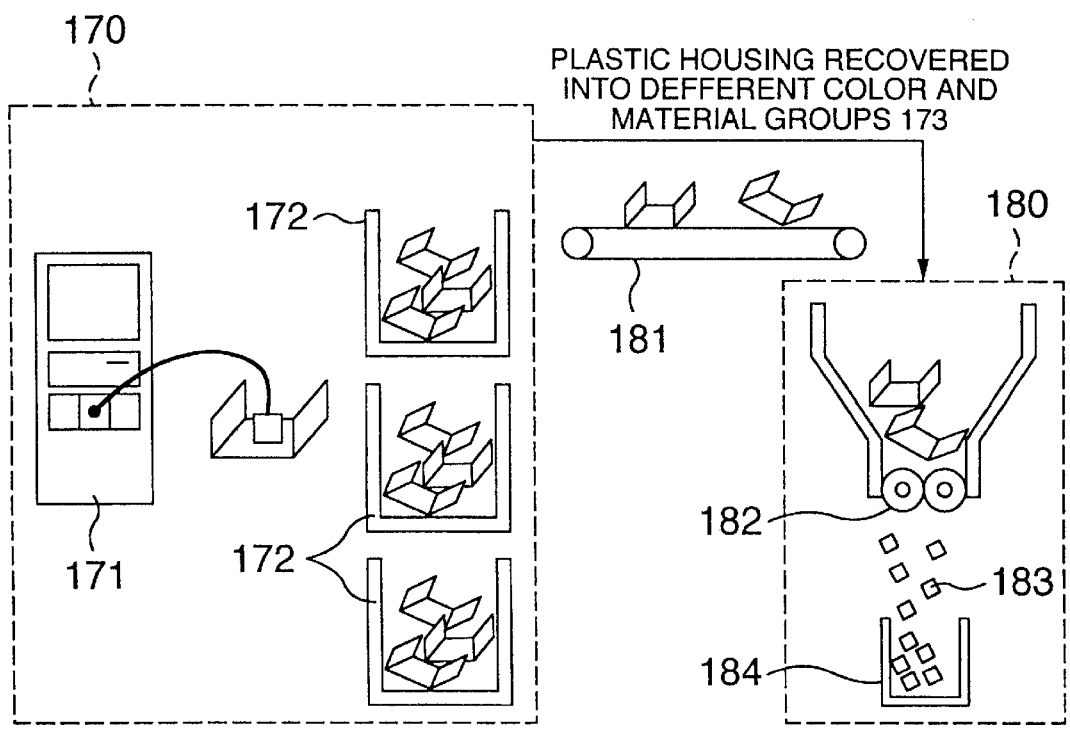
FIG. 12 is a view illustrating a general configuration of an embodiment of a plastic part disposing means.

Referring to FIG. 12 which is a view illustrating a general arrangement of the embodiment of the plastic part processing means 11, the plastic part processing means 11 is composed of a plastic part separating device 170, and a pulverizing device 180. The plastic part separating device 170 includes a color and material recognizing means 171 such as a visible near infrared spectrophotometer, and a plurality of plastic recovery boxes 172. Plastic parts 173 sorted and separated by the plastic part separating device 170 are introduced into the pulverized device 18 composed of a crusher by means of a conveying means 181 such as a conveyer. Fragments 183 (plastics 15) pulverized by a cutting blade rotated in the pulverizing device 80 are received into the plastic boxes 172.

Explanation will be hereinbelow made of the detailed arrangement and the operation of the plastic part sorting device 170. The color and material identifying means 171 identifies, for example, colors and materials of the plastic parts 183 fed from the wrecking section 2, and displays on a display unit. The plastic parts 3 are sorted and separated into different color and material groups and are then introduced into the plastic recovery boxes 172. The number of the plastic recovery boxes 172 is increased in accordance with colors and materials of the plastic parts so as to sort the plastic parts into several color and material groups, thereby it is possible to enhance the quality of recovered plastics.

Next, each of the cooler or material gropes of the plastic parts 173 recovered into the plastic recovery boxes 172 is introduced into the pulverizing device 80 through the intermediary of the conveying means 181. The pulverizing device 180 rotates the cutting blade 182 so as to pulverize the plastic parts 17s into fragments 183 (plastics 15) having a size of less than 10 mm, and the fragments 183 are recovered into a plastic recovery box 184.

Since the plastic parts are sorted and separated by the material identifying means 171 into respective color and material groups, plastics parts having a uniform color or material can be recovered, it is possible to enhance the value of recycling. Since the plastic parts 173 which are recovered into the respective color and material groups are pulverized by the pulverizing device 80, the volume reduction can be made. If the pulverizing device is eliminated from the plastic part processing means 11, the installation cost can be reduced.

Details of the Color and Material Identifying Means 171

Figure 13:
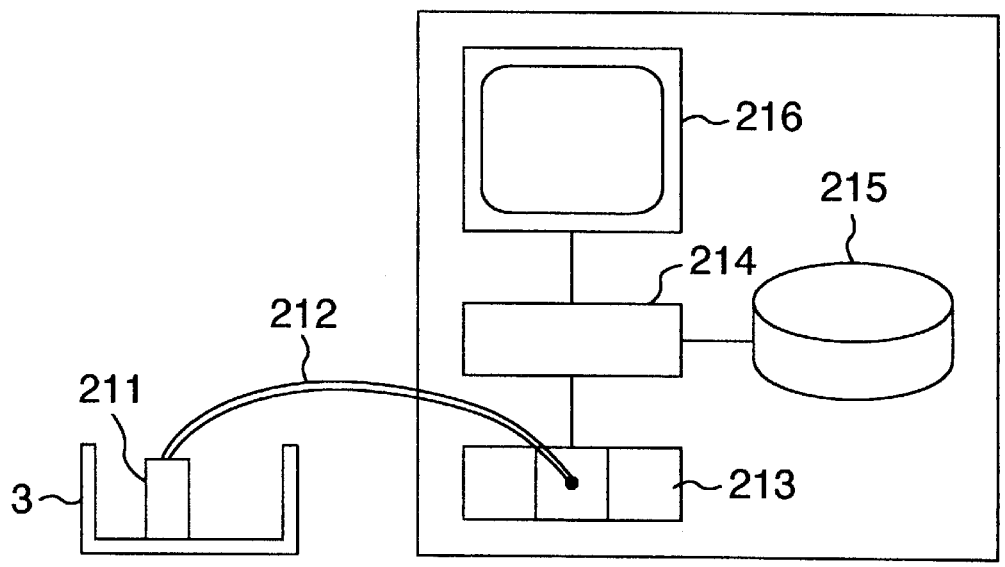
FIG. 13 is a view for explaining process steps for a material identifying means.
Figure 14:
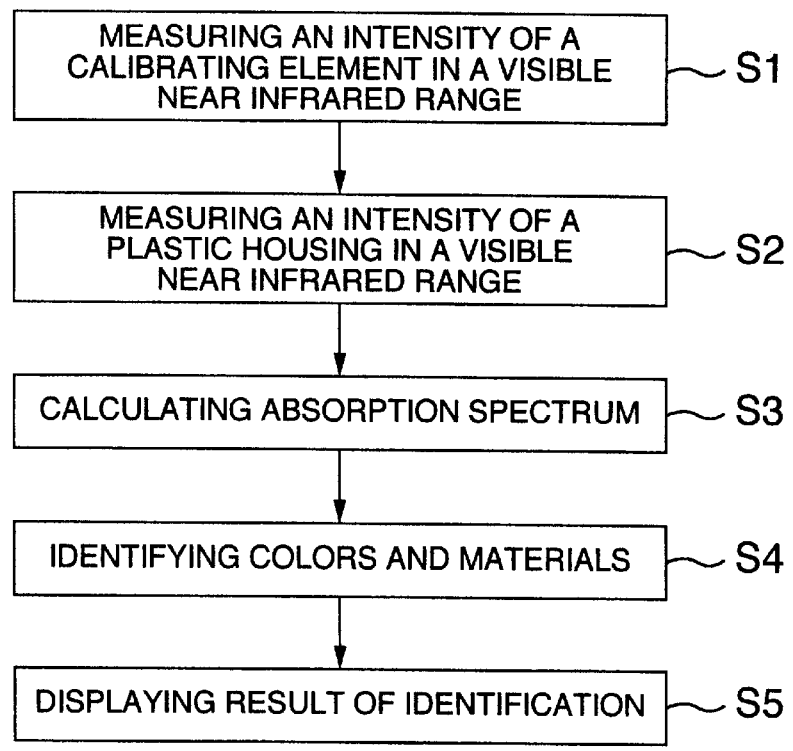
FIG. 14 is a view for explaining process steps for a material identifying means.

Referring to FIG. 13, explanation will be made of the color and material identifying means 171. The color and material identifying means is composed of a light emitting and receiving means 211, a light transmitting means 212 such as a fiber probe connected to the light emitting means 211, and a visible near infrared spectrophotometer means 213 connected to the light transmitting means 212, and an identifying means 214 such as a CPU connected to the visual near infrared spectrophotometer means 213, a spectrum storage means 215 such as a hard disc unit or a memory connected to the identifying means 214, and a display means 216 such as a monitor connected to the identifying means 215.

Explanation will be hereinbelow made of the operation of the color and material identifying means 171 which are formed as mentioned above with reference to a procedure shown in FIG. 14. First, at step S1, an intensity of light corresponding to a calibration element in the visual infrared range is measured. That is, after a white surface made of alumina or a white calibration element such as magnesium carbide, barium sulfide or a milky white glass surface is made into contact with the light emitting means 211, when light is emitted thereto from the visual near infrared spectrophotometer means 213, the light transmitting means 211 transfers light from the visual near infrared spectrophotometer means 213 to the light emitting and receiving means 211. The light emitting receiving means 211 irradiates the light onto the light calibration element, and accordingly the light is reflected thereon, and is then transmitted to the visual near infrared spectrophotometer means 213 through the light emitting and receiving means 211 and the light transmitting means 212. The visible near infrared spectrophotometer means 213 measures an intensity of the transmitted light in the visible near infrared range so as to store the intensity of the light with respect to the calibration element in the near infrared range.

Next, at step S2, a part 32 such as a plastic housing or the like is made into contact with the light emitting and receiving means 211, and then light is emitted from the visible near infrared spectrophotometer means 213 so as to irradiate the light onto the plastic part 3. Accordingly, the irradiated light having a specific wavelength is absorbed by the plastic part 3. Reflected light without being absorbed in the plastic part 3 is transmitted to the visible near infrared spectrophotometer means 213 through the light transmitting and receiving means 211 and the light transmitting means 212.

At step S3, the visible near infrared spectrophotometer means 213 measures an intensity of the reflected light transmitted through the light transmitting means 212 in the near infrared range, and calculates a visual near infrared absorption spectrum with the use of Formula 1:

$$A=\log\{IO/(IO-I)\} \quad (1)$$

where A is an absorbance at each wavelength, IO is an intensity at each wavelength of light with respect to the plastic part 3, and I is an intensity at each wavelength with respect to the plastic part 3. The spectrum corresponding to the plastic part 3 is transmitted to the spectrum identifying means 214.

At step S4, the identifying means 214 compares the measured spectrum transmitted from the visible near infrared spectrophotometer means 213 in contrast with reference spectra of various materials stored in the spectrum storage means 215 in the visible near infrared range (900 to 2,500 nm). Further, if a coincident reference spectrum is obtained, the material relating to this reference spectrum is determined as the material of the plastic part 3, and accordingly, the determined material is displayed on the display means 216 (S5). Further, a difference between the color reference spectra stored in the spectrum storage means 215 and the measured spectrum is obtained in the visible range (280 to 780 mm), and this difference is integrated in the direction of the wavelength. A color with which the integrated value is below the threshold value is determined as the color of the plastic part 3, and then the color data is displayed on the display means 216 (S6).

In another method of determining a color, the measured spectrum is converted into a transmissivity, and tristimulus values are obtained with the use of a color-matching function so as to calculate a color difference. Then, the color difference is compared with a predetermined threshold value, and the reference color determined in accordance a value below the threshold value is used as a color of an object to be sorted, for determination. In further another method, the color of the plastic part 3 is exhibited by a L*a*b*color system and L*u*v*color system with the use of the tristimulus values, and a color difference is obtained with respect to a color of an object to be sorted, and a color determined in such a way that the color difference corresponds to a value below a certain threshold value is determined as a color of the plastic part 3.

The Reusable Part Processing Means 12

The reusable part processing means 12 shown in FIG. 1, cleans, inspects and repairs reusable parts 4 wrecked by the wrecking section 2, and so forth. As the result of the inspection after cleaning, the reusable parts 17 which can be normally operated are recovered for reusing. The reusable parts 14 which malfunction are sent to the pulverizing means 21 so as to be pulverized into fragments which are then disposed, similar to the other waste. It is preferable to repair the reusable parts 14 which malfunction, so as to recovers them as the reusable parts 17 which can be normally operated. Accordingly, the disposal burden for pulverization, sorting and the like for recycling into resources, can be reduced, and further, the environmental burden for waste reclamation can be reduced.

Figure 15:
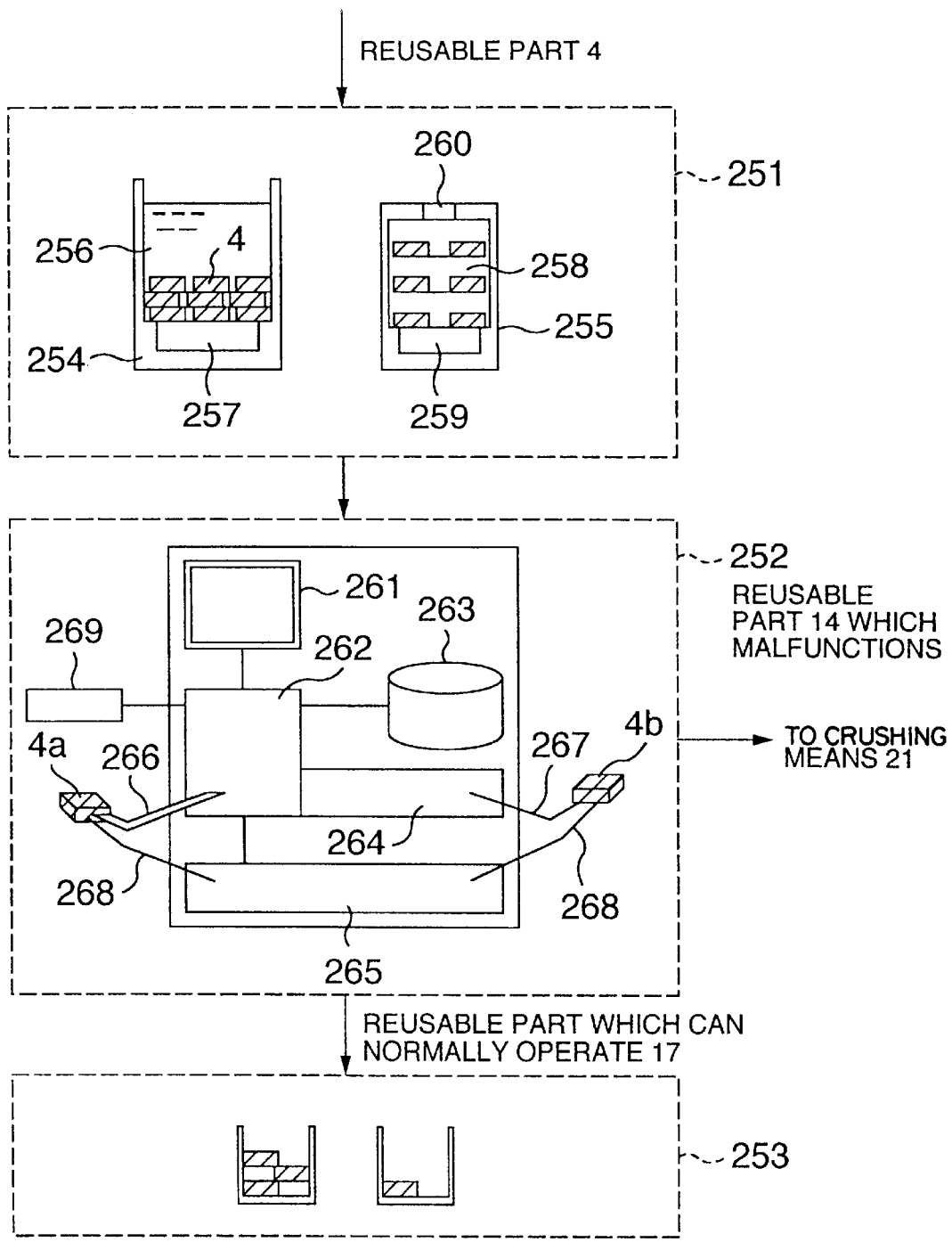
FIG. 15 is a view illustrating a configuration of a reusable part processing means.

Referring to FIG. 15, explanation will be made in detail of the reusable part processing means 12. The reusable part processing means 12 is composed of a cleaning means 251, an inspecting means 252 and recovery boxes 253 for reusable parts 253. The cleaning means 251 is composed of an ultrasonic washing machine 254 and a dryer 252. The ultrasonic washing machine 254 is composed of a tank 256 filled therein with water, and a vibrating means 257 for vibrating the bottom of the tank 256 at a high frequency. The dryer 255 is composed of a drying chamber 258 in which the reusable parts 4 are accommodated, a heating means 259 for maintaining a temperature of the drying chamber 258 at a constant value, and a fan 28 for discharging air from the drying chamber 258 outside of the dryer 255.

The inspecting means 252 is composed of a display means 261 as a monitor, a mother board 262 mounted thereon with a CPU and connected to the display means 261, a storage means 263 such as a hard disc drive or a memory connected to the mother board 262, An SCSI board 264 connected to the mother board 262, a power source 265 for supplying a power to the mother board 262, and an IDE cord 266 connected to the mother board 262, an SCSI cord 267 connected to the SCSI board 264, a power source cord 268 connected to the power source 265, and input means 269 such as a keyboard and a mouse connected to the mother board 262.

Next, explanation will be made of the thus constructed reusable part processing means. Reusable parts are introduced into the tank 256 of the ultrasonic washing machine 254 so as to vibrate the water in the tank at a high frequency by the vibrating means 257 so as to remove dirt on the outer surface of the reusable parts 4. The thus washed reusable parts 4 are introduced into the drying chamber 255 in which the temperature is maintained, for example, in a range of 60 to 61 deg. C. by means of the heating means 259. By raising the temperature in the drying chamber 255, the time required for drying can be reduced. Further, the temperature in the drying chamber 255 is maintained in a range of 60 to 61 deg. C., in order to reduce the provability of damaging the reusable parts 4 by heat. The fan 260 expels wetted air from the drying chamber 25 into the outside so as to enhance the efficiency of drying.

The reusable parts 4 dried by the dryer 255 are selectively connected to the IDE cord 265 of the inspection means 252, the SCSI cord 267 and the power source cord 268 in accordance with kinds thereof. For example, an IDE connection drive 4*a* such as the floppy disc drive, an IDE hard disc drive or the like is connected to the SISC cord 267 and the power source cord 268. An SCSI connection drive 4*b* such as the SCSI hard disc drive, a magneto-optical disc unit or the like is connected to the SCSI cord 267 and the power source cord 266. Further, an inspection starting instruction is delivered through the input means 269, the mother board 262 carries out reading, writing or the like onto the disc as the reusable part 14, following an inspection procedure stored in the storage means 261, so as to determine whether the reusable part 14 is normally operated or not, and the result of the determination is displayed on the displaying means 261. If the reusable part 14 malfunctions, it is sent to the pulverizing means 21, but the reusable part 17 which can be normally operated is recovered into the reusable component recovery box 253.

Further, even though the inspection means 252 determines that the reusable part malfunctions, that is, it is inferior, the part is diagnosed with the use of a tester so as to seek a failure part. Then, if it can be repaired, it can be recovered as the reusable part 17 after repairing and confirmation by retests for normal operation.

It is noted that a blush attached to a suction port for sucking air may be used instead of the ultrasonic washing machine 252, in order to scrape off dirt from the outer surface of the reusable part, the thus scraped-off dirt may be sucked by using a cleaning device. With this arrangement, the necessity of drying can be eliminated, and the time required for cleaning can be shortened.

As mentioned above, according to the present invention, in order that the waste including circuit boards is pulverized so as to recover valuables, since the circuit boards are sorted and separated, lead contained in the circuit board can be recovered without being diffused, and further, it is possible to enhance the qualities of valuables such as nonferrous metals and plastics to be recovered. Further, in order to dispose waste including circuit boards so as to recover valuables, such a process that pulverized fragments of circuit boards sorted and separated from fragments of other waste can be automated.

Further, it is possible to enhance the qualities such as colors and the materials of recovered plastics.

What is claimed is:

1. A waste disposal method comprising the steps of crushing waste including a circuit board and plastics other than that of the circuit board, into fragments, thereafter, sorting and separating iron from the fragments of the waste through magnetic sorting, sorting and separating fragments of the circuit board from the fragments from which iron is separated, sorting and separating fragments of nonferrous metals from the remaining fragments of waste from which the fragments of the circuit board are separated through eddy current sorting, and sorting and separating fragments of plastics from fragments of the waste from which the fragments of nonferrous metal are separated through specific gravity sorting.

2. A waste disposal method as set forth in claim 1, wherein the sorting of the fragments of the circuit board is carried out through detection of fragments having a color corresponding to a preset specified color of the circuit board during conveyance of the fragments of the waste.

3. A waste disposal method as set forth in claim 2, wherein the sorting of the fragments of the circuit board is carried out by applying a.c. current to a coil located being opposed to the fragments to be conveyed during conveyance of the fragments of the waste so as to detect the fragments of the circuit board in accordance with a variation in the a.c. current.

4. A waste disposal apparatus comprising a crushing means for crushing waste, including a circuit board and plastics other than that of the circuit board, into fragments, an iron sorting means for sorting and separating fragments of iron from the fragments of the waste, crushed by the crushing means, through magnetic sorting, a circuit board sorting means for sorting fragments of the circuit board from the fragments of the waste from which iron is separated by the iron sorting means, and an eddy current type metal sorting means and a plastic sorting means with specific gravity sorting, for respectively sorting and separating fragments of nonferrous metals and plastics from the fragments of the waste from which the fragments of the circuit board are separated by the circuit board sorting means.

5. A waste disposal apparatus as set forth in claim 4, wherein said circuit board sorting means is composed of an image pick-up means opposed to the fragments conveyed on a conveying path, a circuit board identifying means for comparing a color of an image of a fragment picked up by the image pick-up means in contrast with at least one of preset reference colors so as to determine whether the fragment is one of the fragments of the circuit board or one of the remaining fragments of the waste, and a separating means for separating the fragment of the circuit board, which is identified by the circuit board identifying means, from the conveying path.

6. A waste disposal apparatus as set forth in claim 5, wherein the circuit board sorting means is provided with an array means for arraying the fragments to be conveyed in a row, being spaced from one another.

7. A waste disposal apparatus as set forth in claim 5, wherein said separating means is composed of a circular rotary table rotatably journalled, a ring-like fragment receiving part, defined on the rotary table between outer and inner peripheral walls, for receiving the fragments of the waste to be conveyed, a plurality of openable and closable doors formed in the outer peripheral wall and arranged adjacent to one another peripheral wall, a means for opening and closing the doors, an image pick-up means for picking up an image from the inside of the fragment receiving part, a circuit board identifying means for comparing a color of an image of a fragment picked up by the image pick-up means in contrast with at least one of preset specified colors so as to determine whether the fragment is one of the fragments of the circuit board or one of the remaining fragments of the waste, and a control means for controlling the rotary table and the door opening and closing means, wherein the control means stores a position of a door where the fragment of the circuit board is stored in accordance with a circuit board identifying signal from the circuit board identifying means, and delivers a signal to the door opening and closing means when the door comes to a predetermined position so as to open the door.

8. A waste disposal apparatus as set forth in claim 4, wherein said circuit board sorting means is composed of a coil located being opposed to the fragments to be conveyed, a power source for applying a.c. current to the coil, a means irradiating near infrared radiation to a fragment, for measuring near infrared spectra of near infrared radiation reflected therefrom so as to determine a kind of plastic thereof, and a circuit board identifying means for detecting a fragment of the circuit board in accordance with a variation in the a.c. current and a result of determination of a kind of plastic of the fragment.

\* \* \* \* \*